US010631422B2

(12) United States Patent
Gilmore et al.

(10) Patent No.: US 10,631,422 B2
(45) Date of Patent: *Apr. 21, 2020

(54) AUTOMATIC TESTABLE BREATHER VALVE

(71) Applicant: MOTOROLA SOLUTIONS, INC., Chicago, IL (US)

(72) Inventors: Peter Gilmore, Plantation, FL (US); George Mtchedlishvili, Hallandale Beach, FL (US); Chee Kit Chan, Penang (MY); Andrew P. Miehl, Boca Raton, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/363,475

(22) Filed: Mar. 25, 2019

(65) Prior Publication Data
US 2020/0029453 A1    Jan. 23, 2020

Related U.S. Application Data

(63) Continuation of application No. 16/037,741, filed on Jul. 17, 2018, now Pat. No. 10,264,693.

(51) Int. Cl.
*H05K 5/06* (2006.01)
*H05K 5/02* (2006.01)
(Continued)

(52) U.S. Cl.
CPC .......... *H05K 5/069* (2013.01); *H05K 5/0086* (2013.01); *H05K 5/0217* (2013.01); *H05K 5/068* (2013.01);
(Continued)

(58) Field of Classification Search
CPC ...... H05K 5/068; H05K 5/069; H05K 5/0086; H05K 5/0217; H04B 1/3827; H04B 2001/3894
See application file for complete search history.

(56) References Cited

U.S. PATENT DOCUMENTS 4,465,189 A * 8/1984 Molzan .............. B65D 51/1644
206/524.8
4,534,208 A   8/1985 Macin et al.
(Continued)

FOREIGN PATENT DOCUMENTS

| EP | 3403934 A1 | 11/2018 |
| GB | 2500068 A | 11/2013 |
| WO | 96/16288 | 5/1996 |

OTHER PUBLICATIONS

Gore, "Protective Vents Screw-in-Series, Increase outdoor enclosure durability in harsh environments," brochure (2011-2017) 4 pages, http://www.gore.com/sites/g/tiles/ypyipe116/files/2017-11/PTV_Datasheet-Screw-In-Vents_EN.pdf.
(Continued)

*Primary Examiner* — Adrian S Wilson
(74) *Attorney, Agent, or Firm* — Michael Best & Friedrich LLP

(57) ABSTRACT

A breather valve and a portable communication device including a breather valve are provided. The breather valve includes a housing having a bottom portion having an opening and side portions, a rigid substrate located within the housing and a breathable membrane mounted to the rigid substrate. The breather valve further includes a gasket having a top surface and a bottom surface, and a preloaded compression element across the gasket and the rigid substrate. The gasket has an upper energy director located at the top surface and a lower energy director located at the bottom surface. The preloaded compression element provides at least a first compressive position providing a contact between the lower energy director and the bottom portion of the housing and a second compressive position in which air passes around the lower energy director and the upper energy director.

20 Claims, 13 Drawing Sheets

(51) Int. Cl.
*H05K 5/00* (2006.01)
*H04B 1/38* (2015.01)
*H04B 1/3827* (2015.01)

(52) U.S. Cl.
CPC .... *H04B 1/3827* (2013.01); *H04B 2001/3894* (2013.01)

(56) References Cited

U.S. PATENT DOCUMENTS

| | | | |
|---|---|---|---|
| 5,338,908 A * | 8/1994 | Rahman | H01H 9/047 200/302.1 |
| 6,297,448 B1 * | 10/2001 | Hara | H05K 5/0047 174/50.5 |
| 6,486,398 B1 | 11/2002 | McCulloch et al. | |
| 9,667,297 B1 | 5/2017 | Miehll et al. | |
| 10,264,693 B1 * | 4/2019 | Gilmore | H05K 5/068 |
| 2001/0017212 A1 * | 8/2001 | Hirano | H05K 5/068 174/17 GF |
| 2008/0196918 A1 * | 8/2008 | Zadach | H05K 5/068 174/50.5 |
| 2015/0114090 A1 | 4/2015 | Fukuda | |
| 2015/0306529 A1 * | 10/2015 | Yano | B01D 46/0002 96/7 |
| 2017/0086321 A1 | 3/2017 | de Jong et al. | |
| 2017/0132954 A1 * | 5/2017 | Birk | B65D 77/225 |
| 2017/0179991 A1 | 6/2017 | Miehl et al. | |

OTHER PUBLICATIONS

United Kingdom (UKIPO) Combined Search Report and Examination Report Under Sections 17 and 18(3) dated Aug. 30, 2019 for related UKIPO Application No. GB1908995.2 (7 pages).

* cited by examiner

AUTOMATIC TESTABLE BREATHER VALVE

BACKGROUND OF THE INVENTION

Electronic devices are designed with sealed housings to prevent damage to the electronics from water or fluid ingress. The sealed housings also prevent any air from being transferred into or out of the electronic devices. Many electronic devices, especially those used in public safety situations, are used in extreme environmental conditions. When used in extreme environmental conditions, a pressure difference is created between the inside and the outside of the sealed housing due to heating or cooling of the air inside the sealed housing. However, because the housing is sealed, no air can escape or enter the housing to balance the pressure difference. This difference of air pressure may negatively affect transmission and reception performance of the electronic device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
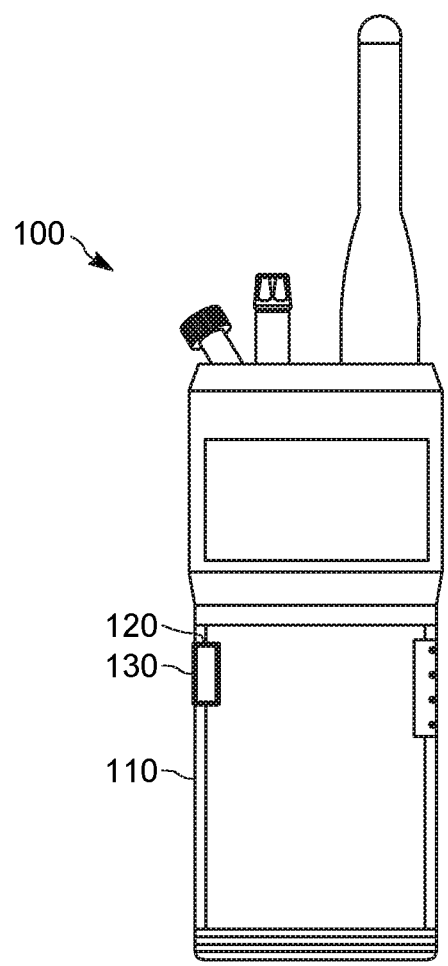
FIG. 1 illustrates a portable communication device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Electronic devices are equipped with breather membranes to balance the air pressure between the inside and the outside of the housing. Breather membranes are permeable to air but impermeable to water. Accordingly, in situations where the air pressure inside the housing is different than the air pressure outside the housing, the breather membrane allows air to flow between the inside and the outside of the housing to balance the air pressure.

During manufacturing of electronic devices, breather membranes are usually tested to check the breather membranes' flow rate. The electronic devices' other water seals are also checked for proper functioning while the breather membrane is disabled. Typically, manufacturers include a separate test port and a means to disable the breather membrane to test for the above conditions. However, this may not provide accurate information regarding the functioning of the test port seal. In some situations, the test port may not be closed properly, which may lead to fluid ingress during operation. Additionally, current testing methods are time consuming resulting in increased manufacturing times.

Accordingly, there is a need for an automatic testable breather valve for electronic or portable communication devices that can be tested directly and in a time efficient manner.

One embodiment provides a breather valve including a housing having a bottom portion having an opening and side portions and a rigid substrate located within the housing. The breather valve also includes a breathable membrane mounted to the rigid substrate. The rigid substrate forms an aperture that allows the breathable membrane to breathe. The breather valve further includes a gasket having a top surface and a bottom surface. The gasket has an upper energy director located at the top surface and a lower energy director located at the bottom surface. The breather valve also includes a preloaded compression element across the gasket and the rigid substrate. The preloaded compression element provides at least a first compressive position providing a contact between the lower energy director and the bottom portion of the housing, and a second compressive position in which air passes around the lower energy director and the upper energy director.

Another embodiment provides a portable communication device including a sealed, device housing having a valve opening between an exterior and an interior of the portable communication device. The portable communication device also includes a breather valve positioned at the valve opening. The breather valve includes a housing having a bottom portion having an opening and side portions and a rigid substrate located within the housing. The breather valve also includes a breathable membrane mounted to the rigid substrate. The rigid substrate forms an aperture that allows the breathable membrane to breathe. The breather valve further includes a gasket having a top surface and a bottom surface. The gasket has an upper energy director located at the top surface and a lower energy director located at the bottom surface. The breather valve also includes a preloaded compression element across the gasket and the rigid substrate. The preloaded compression element provides at least a first compressive position providing a contact between the lower energy director and the bottom portion of the housing, and a second compressive position in which air passes around the lower energy director and the upper energy director.

FIG. 1 illustrates one example embodiment of a portable communication device 100 (for example, an electronic device). The portable communication device 100 includes a sealed housing 110 (for example, a sealed, device housing), a valve opening 120, and a breather valve 130 positioned at the valve opening 120. The portable communication device 100 is, for example, a mobile two-way radio, a smart telephone, a tablet computer, a laptop computer, a smart wearable device, or the like. The sealed housing 110 may be sealed and prevents water or fluid ingress into the portable communication device 100. The sealed housing 110 also prevents air from flowing between the inside and the outside of the portable communication device 100. The valve opening 120 is provided in the sealed housing 110 and is sized, shaped, and otherwise configured to receive the breather valve 130.

Figure 2:
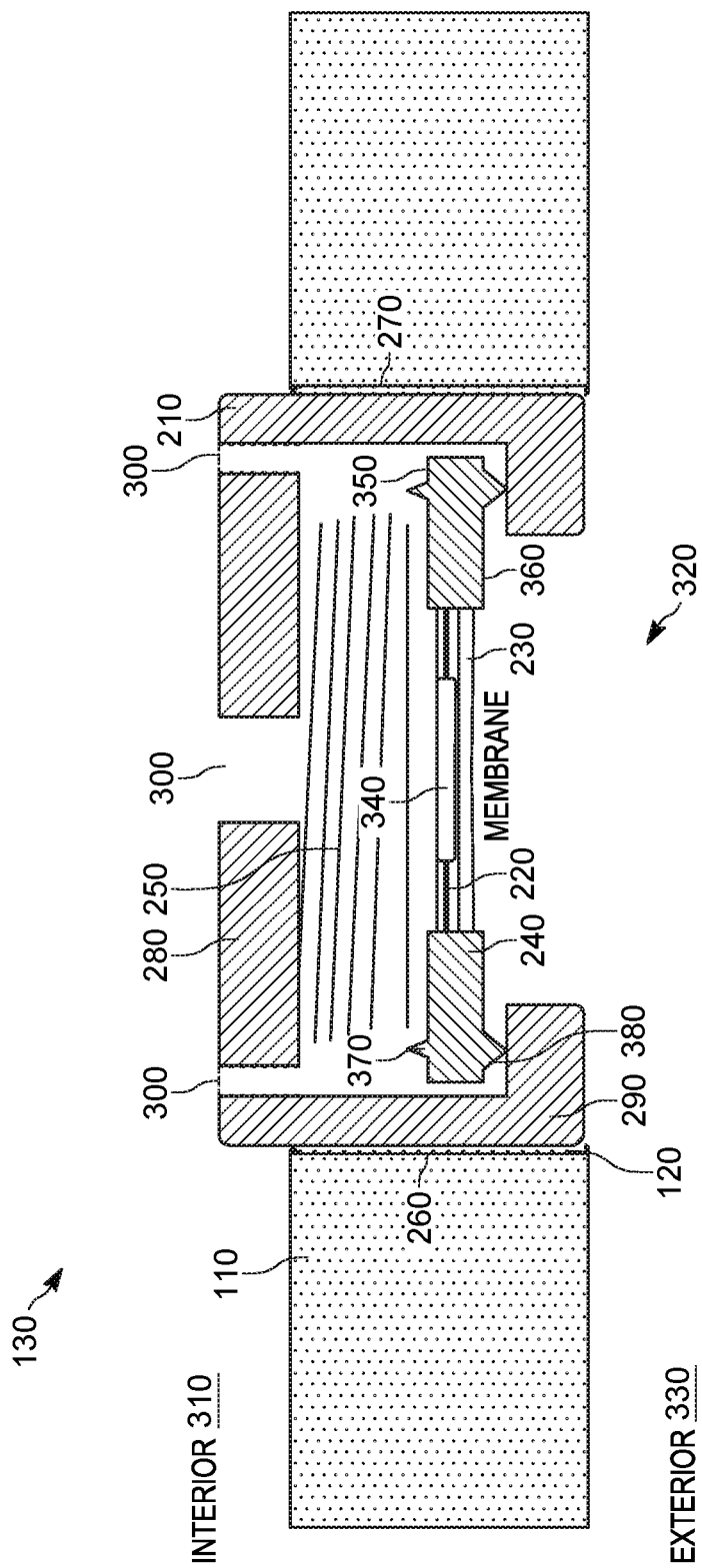
FIG. 2 illustrates a breather valve of the portable communication device of FIG. 1 during a normal operating condition in accordance with some embodiments.

FIG. 2 illustrates one example embodiment of the breather valve 130. The breather valve 130 includes a housing 210, a rigid substrate 220, a breathable membrane 230, a gasket 240, and a preloaded compression element 250. The housing 210 is fastened to a valve opening 120 in the sealed housing 110 of the portable communication device 100. The housing 210 includes threaded grooves 260 (for example, second threaded grooves) on the outer surfaces of the side portions of the housing 210 that are received in the threaded grooves 270 (for example, first threaded grooves) of the valve opening 120 (or the sealed housing 110) to fasten that housing 210 to the portable communication device 100. Other fastening means may also be used to fasten the housing 210 to the portable communication device 100. The housing 210 includes a top portion 280 and a bottom portion 290. The top portion 280 includes a plurality of openings 300 into the interior 310 of the sealed housing 110. The bottom portion 290 includes an opening 320 to the exterior 330 of the sealed housing 110.

The rigid substrate 220 is made of a rigid material, for example, a stainless steel substrate and provides support for the breathable membrane 230. The breathable membrane 230 may include an adhesive backing or adhesive seal (not shown) that mounts the breathable membrane 230 to the rigid substrate 220. The breathable membrane 230 is made of a breathable material that is permeable to air but impermeable to water, for example, polytetrafluoroethylene (PTFE), polypropylene, polyethylene, and the like. In one example, the breathable membrane 230 is a GORE® membrane sold by W.L Gore and Associates Inc. The rigid substrate 220 forms an aperture 340 over which the breathable membrane 230 is placed. This allows the water sealed housing 110 to equalize air pressure differential.

The gasket 240 is over molded to the perimeter of the rigid substrate 220 and the breathable membrane 230 and includes an opening in the center to expose the rigid substrate 220 and the breathable membrane 230. The gasket 240 includes a top surface 350 and a bottom surface 360. An upper energy director 370 is located on the top surface 350 of the gasket 240. The upper energy director 370 may be formed continuously along or near the outer perimeter of the top surface 350 of the gasket 240. In some embodiments, the upper energy director 370 may be perforated rather than continuous along or near the perimeter of the top surface 350. For example, the upper energy director 370 is perforated rather than continuous in embodiments where the breather valve 200 is configured for evaluating every other water seal of the portable communication device 100. In these embodiments, the upper energy director 370 may be configured as the preloaded compression element 250 thereby eliminating the need for a separate preloaded compression element 250. A lower energy director 380 is located on the bottom surface 360 of the gasket 240. The lower energy director 380 is formed continuously along or near the outer perimeter of the bottom surface 360 of the gasket 240.

The preloaded compression element 250 is provided between the gasket 240 and the top portion 280. The preloaded compression element 250 is provided across the gasket 240 and the rigid substrate 220. The preloaded compression element 250 provides several compressive positions as detailed below. In the example illustrated, the preloaded compression element 250 is a preloaded spring. However, other preloaded compression elements that provide several compressive positions may also be used.

Figure 3:
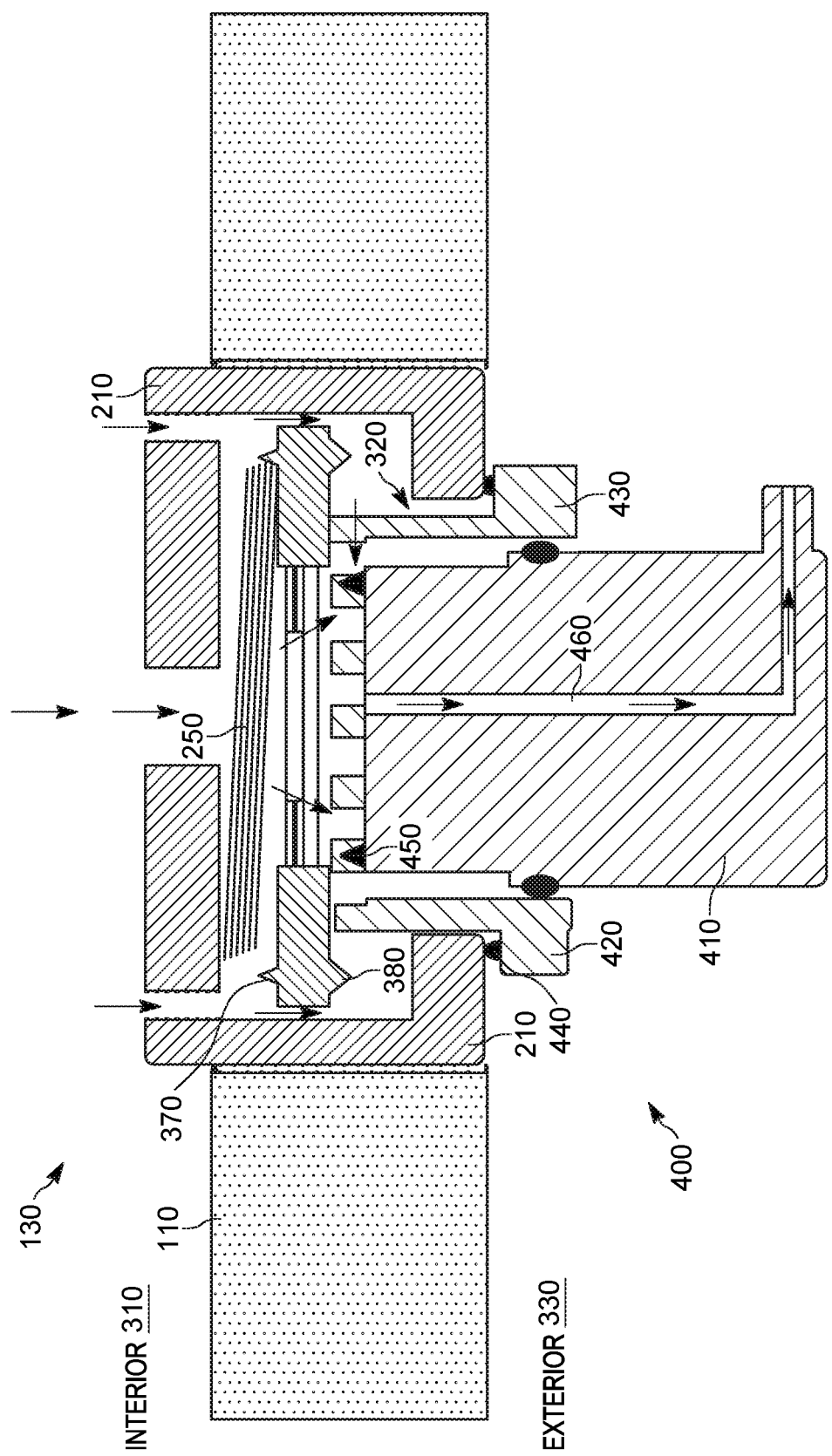
FIG. 3 illustrates the breather valve of FIG. 2 during a vacuum test in accordance with some embodiments.

FIG. 3 illustrates one example embodiment of the breather valve 130 during a vacuum test of the portable communication device 100. A probe device 400 (for example, external probe) is used to conduct the vacuum test of the portable communication device 100. The probe device 400 includes an inner probe 410 and an outer probe 420 that are co-axial with each other. The inner probe 410 can move up and down within the outer probe 420 to test for various conditions of the portable communication device 100. The outer probe 420 includes an overhang 430 having a first sealing director 440 continuously formed along or near the perimeter of the overhang 430. The outer probe 420 is constructed to fit within the opening 320 of the bottom portion 290. The outer probe 420 forms an opening in the center to receive the inner probe 410. The inner probe 410 includes a second sealing director 450 on a top surface of the inner probe 410. The inner probe 410 includes a flow channel 460 that extends from the top surface of the inner probe 410 to an outer surface of the inner probe 410. The flow channel 460 may be connected to a vacuum to suck the air from the inside of the portable communication device 100. The flow channel 460 may also be connected to a pressure detector to detect an internal air pressure of the portable communication device 100.

Referring to FIG. 2, the breather valve 130 in a normal operating condition of the portable communication device 100 is illustrated. During normal operation, the preloaded compression element 250 provides a first compressive position that provides a contact between the lower energy director 380 and the bottom portion 290 of the housing 210. In the first compressive portion, the lower energy director 380 forms a seal around the opening 320 in the bottom portion 290. The seal formed by the lower energy director 380 prevents air and water from penetrating through the gasket 240 or the breather valve 130 into the portable communication device 100.

Referring to FIG. 3, the breather valve 130 is illustrated in a vacuum test condition of the portable communication device 100. During the vacuum test, the preloaded compression element 250 provides a second compressive position in which air passes around the lower energy director 380 and the upper energy director 370. The preloaded compression element 250 is placed in the second compressive position by pressing the probe device 400 into the opening 320 in the bottom portion 290. The inner probe 410 is retracted within the outer probe 420. The outer probe 420 pushes the gasket 240 upward compressing the preloaded compression element 250 into the second position. In this position, the first sealing director 440 seals the opening 320 in the bottom portion 290. The seal formed by the first sealing director 440 prevents any air or water from flowing through the opening 320.

To conduct the vacuum test, the flow channel 460 is connected to a vacuum (not shown) to suck the air from the inside of the portable communication device 100. This vacuum test, also referred to as an unrestricted vacuum test, is conducted when the air flow between the interior 310 and the exterior 330 of the portable communication device 100 is unrestricted by the breathable membrane 230. As described above, the outer probe 420 moves the breathable membrane 230 to unrestrict the air flow. The unrestricted vacuum test allows for checking any leaks in the sealed housing 110. The flow rate through the flow channel 460 is measured. The vacuum test is considered successful if the flow rate through the flow channel 460 approaches zero. In some existing testing techniques, a test port separate from the breather valve 130 is used to perform the unrestricted vacuum test. However, the second compressive position of the preloaded compression element 250 allows for the unrestricted vacuum test to be conducted using the breather valve 130. Thereby, the requirement for a separate test port is eliminated.

Figure 4:
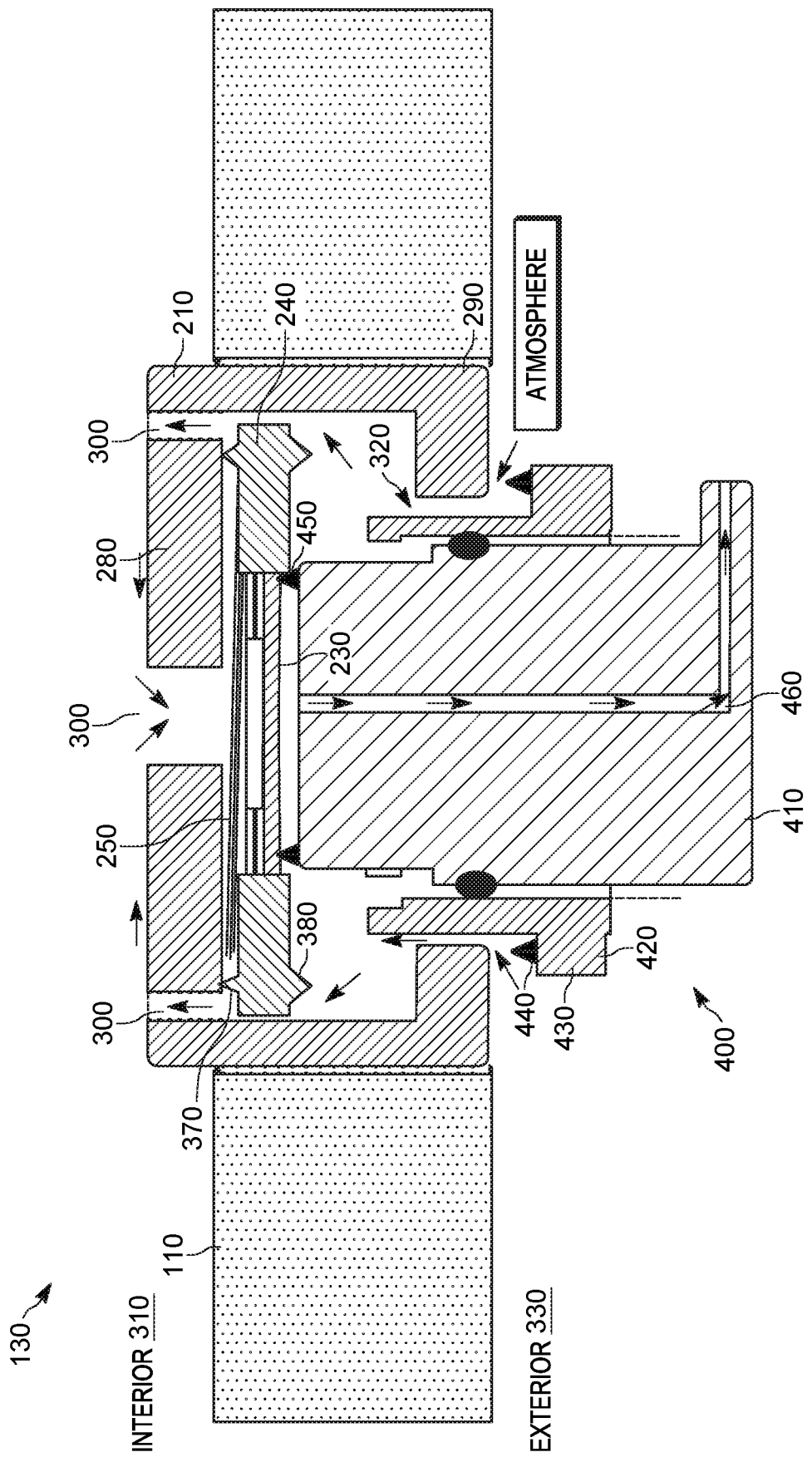
FIG. 4 illustrates the breather valve of FIG. 2 during a flow test in accordance with some embodiments.

FIG. 4 illustrates one example embodiment of the breather valve 130 during a flow test of the breather valve 130. During the flow test, the preloaded compression element 250 provides a third compressive position providing a contact between the upper energy director 370 and the top portion 280 of the housing 210. The preloaded compression element 250 is placed in the third compressive position by pressing the probe device 400 into the opening 320 in the bottom portion 290. The outer probe 420 is retracted such that the first sealing director 440 is not in contact with the bottom portion 290. The inner probe 410 is extended through the outer probe 420 such that the second sealing director 450 pushes the gasket 240 upward compressing the preloaded compression element 250 into the third position. In this position, no seal is formed between the plurality of openings 300 or the opening 320 to allow for air to flow between the interior 310 and the exterior 330 of the portable communication device 100.

To conduct the flow test, the flow channel 460 is connected to a vacuum (not shown) to suck the air from the inside of the portable communication device 100. This flow test is conducted when the air flow between the interior 310 and the exterior 330 of the portable communication device 100 is restricted by the breathable membrane 230. As described above, the outer probe 420 is retracted to prevent a seal of the opening 320 by the first sealing director 440 and the inner probe 410 is extended to prevent a seal of the opening 320 by the lower energy director 380. In this position, the vacuum is operated and the flow rate through the flow channel 460 is measured. During the flow test, the air flows from the exterior 330 of the portable communication device 100 through the opening 320 around the gasket 240 through side openings of the plurality of openings 300 to the interior 310 of the portable communication device 100. The air then flows from the interior 310 of the portable communication device 100 through the middle opening(s) of the plurality of the openings 300 and the breathable membrane 230 to the flow channel 460. As a result, the flow rate through the breathable membrane 230 can be checked by measuring the flow rate through the flow channel 460. The flow test is considered successful when the measured flow rate approaches the rated flow rate of the breathable membrane 230. In one example, the flow test is considered successful when the measured flow rate approaches 200+/− 75 liter per hour per centimeter squared of the breathable membrane 230 at a vacuum pressure of 70 millibars.

Figure 5:
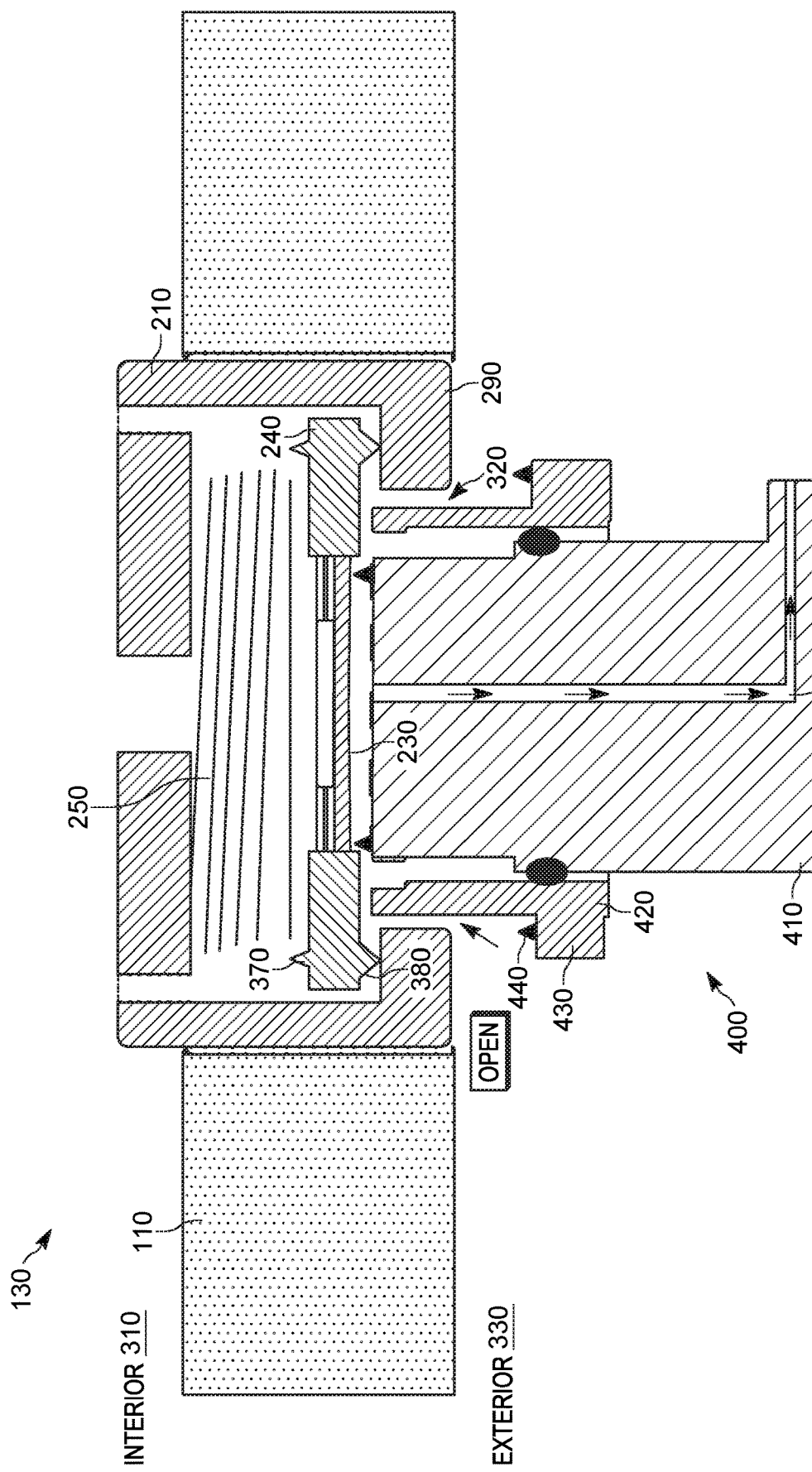
FIG. 5 illustrates the breather valve of FIG. 2 during a test to ensure the breather valve is shut in accordance with some embodiments.

FIG. 5 illustrates one example embodiment of the breather valve 130 during a test to ensure the breather valve 130 is shut. During the test to ensure the breather valve 130 is shut, the preloaded compression element 250 is placed back in the first compressive position that provides a contact between the lower energy director 380 and the bottom portion 290 of the housing 210. The preloaded compression element 250 is provided such that the preloaded compression element 250 automatically returns to the first preloaded position when undisturbed by the probe device 400. Both the inner probe 410 and the outer probe 420 are retracted from the breather valve 130 such that the outer probe 420 and inner probe 410 are at the opening 320 without compressing the preloaded compression element 250.

To conduct the test to ensure the breather valve 130 is shut, the flow channel 460 is connected to the vacuum (not shown) and the flow rate through the flow channel 460 is measured. Because no air can flow into the portable communication device 100 is the breather valve 130 is properly shut, the flow rate should approach zero.

The preloaded compression element 250 thereby allows the breathable membrane 230 be placed in different positions for conducting various tests and automatically closes or automatically returns to the first compressive position to provide a seal between the gasket 240 and the opening 320.

Figure 6:
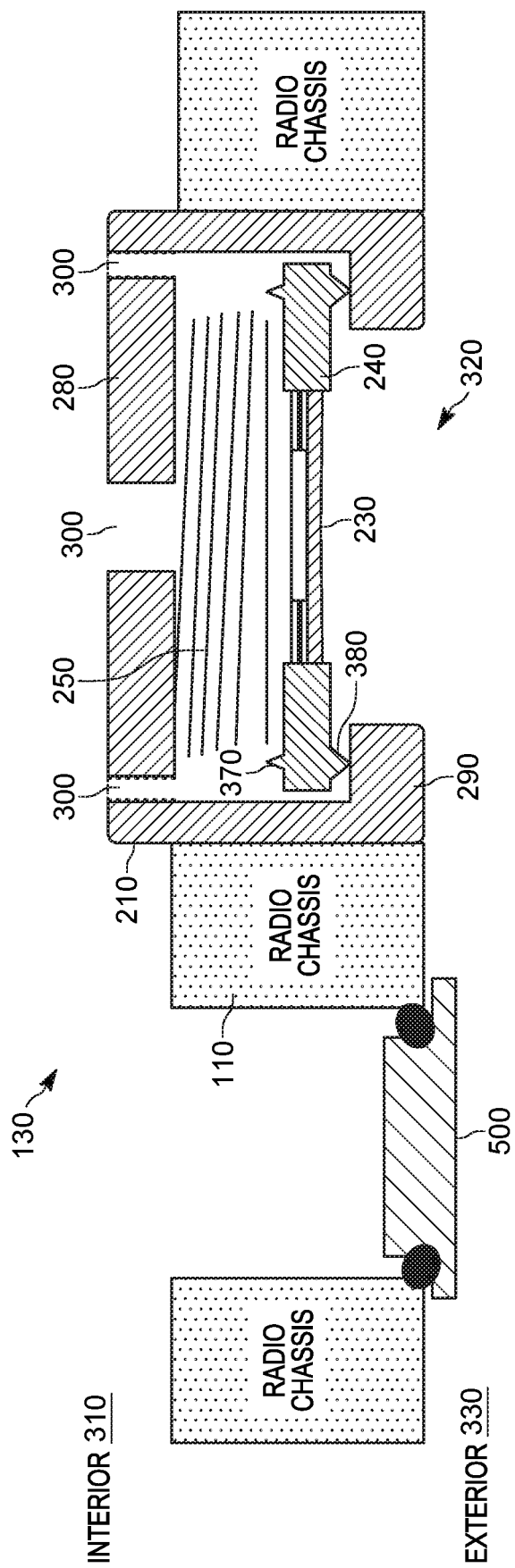
FIG. 6 illustrates the breather valve of FIG. 2 during a normal operating condition in accordance with some embodiments.
Figure 7:
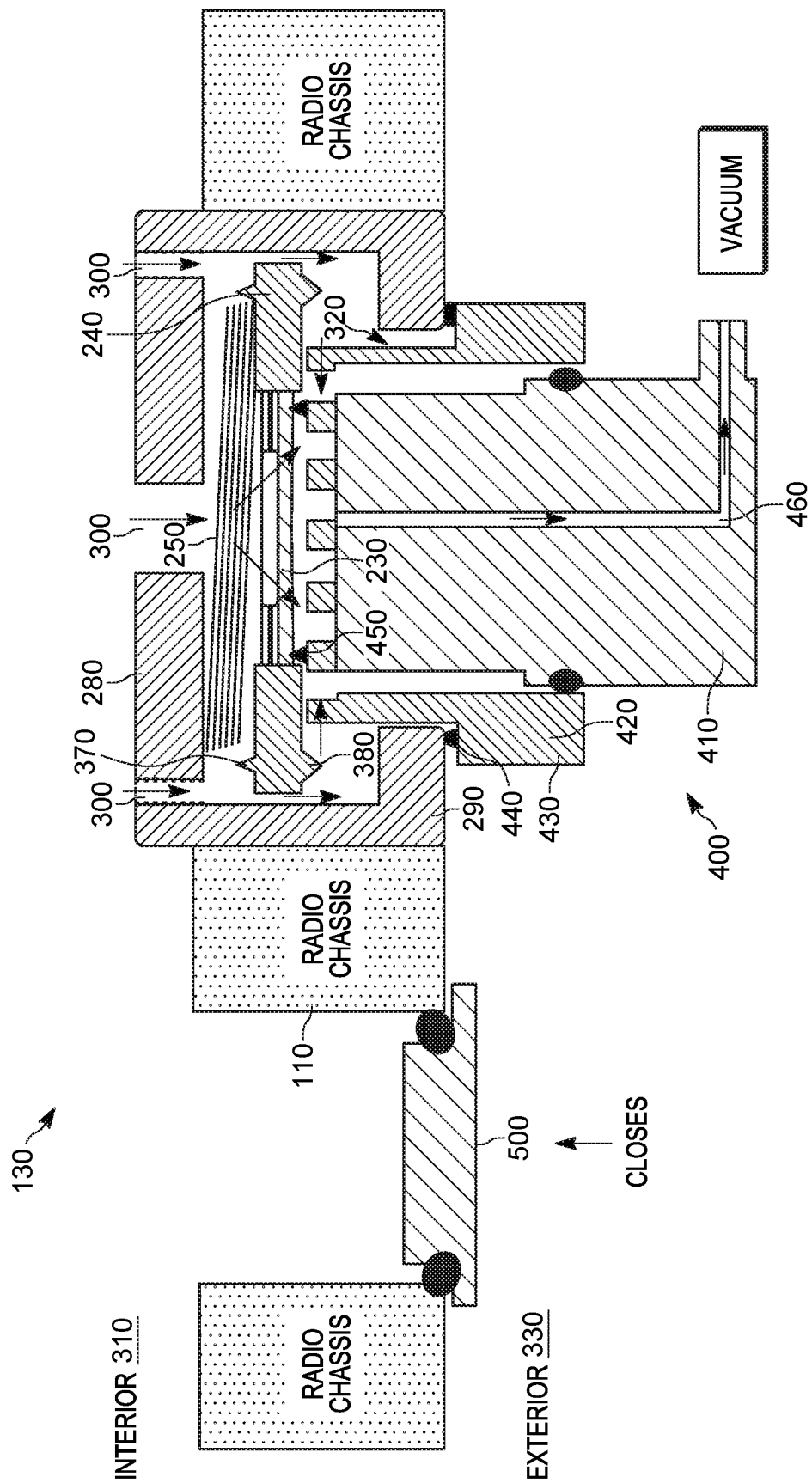
FIG. 7 illustrates the breather valve of FIG. 2 during a vacuum test in accordance with some embodiments.
Figure 8:
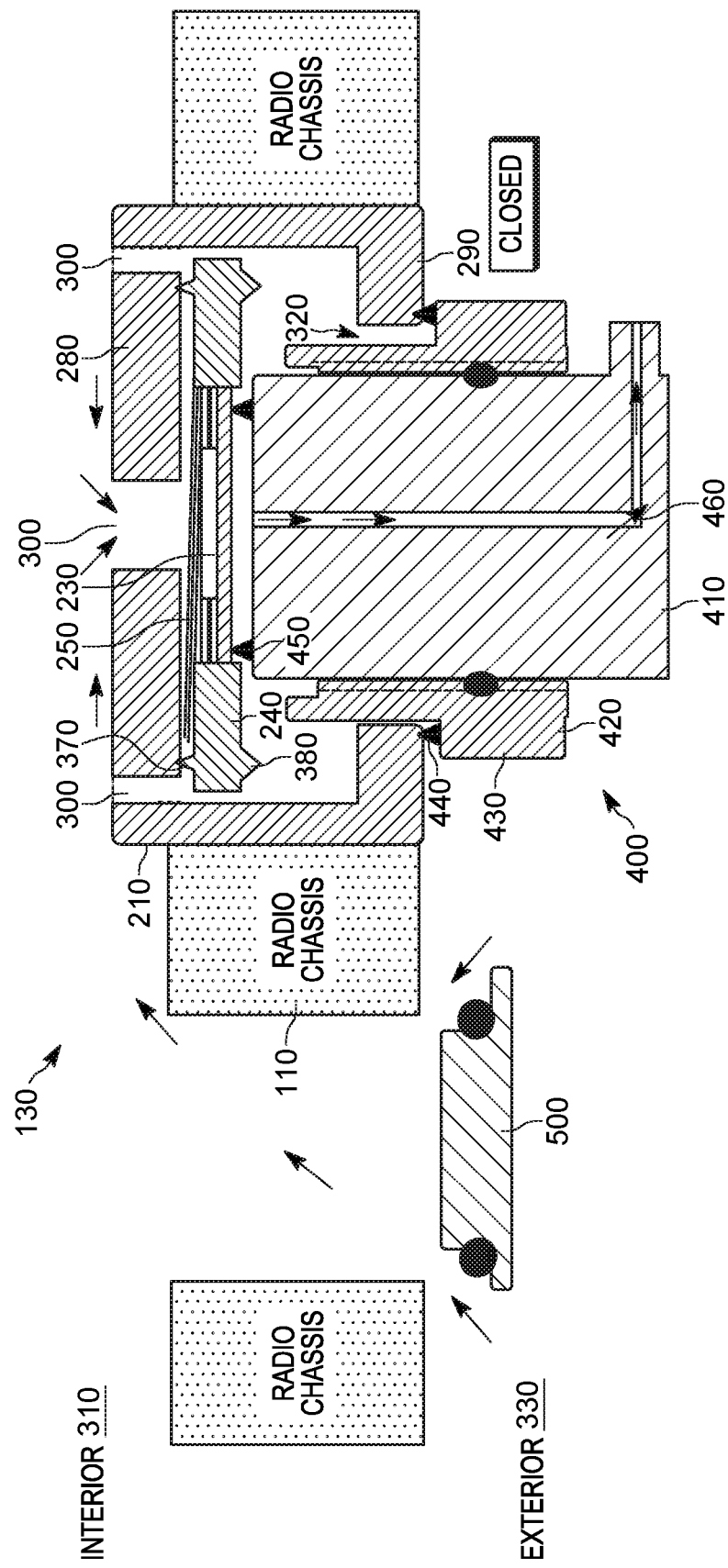
FIG. 8 illustrates the breather valve of FIG. 2 during a flow test in accordance with some embodiments.
Figure 9:
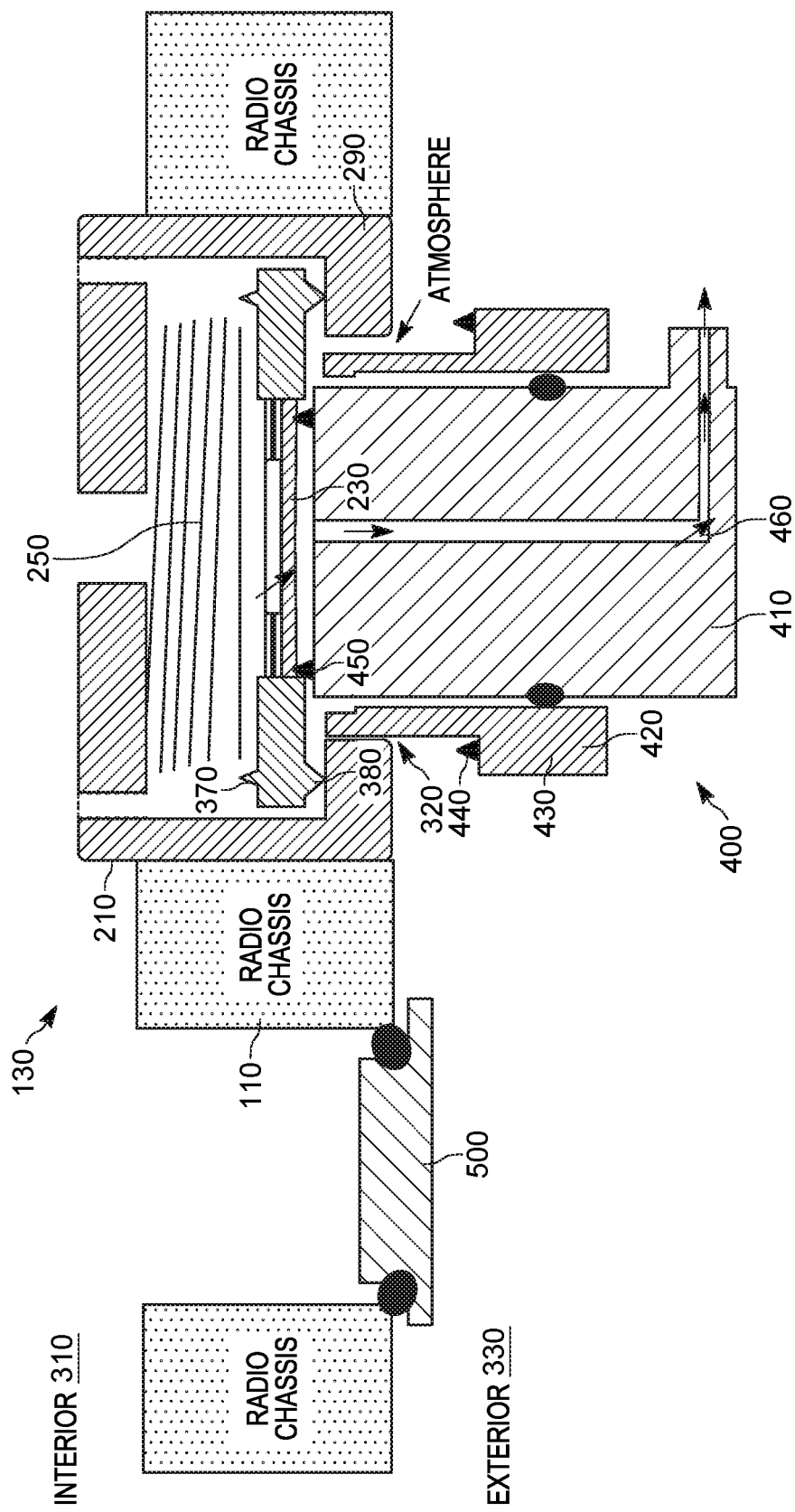
FIG. 9 illustrates the breather valve of FIG. 2 during a test to ensure the breather valve is shut in accordance with some embodiments.

FIGS. 6-9 illustrate an alternative embodiment of the portable communication device 100 including the breather valve 130. In these embodiments, the portable communication device 100 may include other openings, for example, a secure digital (SD) card door 500 or a subscriber identity module (SIM) card door 500. The SD card door 500 may be utilized to perform the various tests as described above. FIG. 6 illustrates the normal operating condition of the breather valve 130. During normal operation, the SD card door 500 is closed to prevent any fluid or air flow into the portable communication device 100. However, the portable communication device 100 can breathe through the breathable membrane 230. Similarly, during the vacuum test and the test to ensure the breather valve 130 is shut, the SD card door 500 is closed to prevent any air flow to the inside of the portable communication device 100. However, during the flow test, the SD card door 500 is opened to allow air flow from the exterior 330 to the interior 310 of the portable communication device 100. The outer probe 420 need not be retracted and the first sealing director 440 may provide a seal for the opening 320. When the vacuum is operated, the air flow from the exterior 330 through the SD card door 500 to the interior 310. The air then flows from the inside through the breathable membrane 230 to the flow channel 460. Accordingly, the SD card door 500 may be used to efficiently conduct the tests for the breather valve 130.

Figure 10:
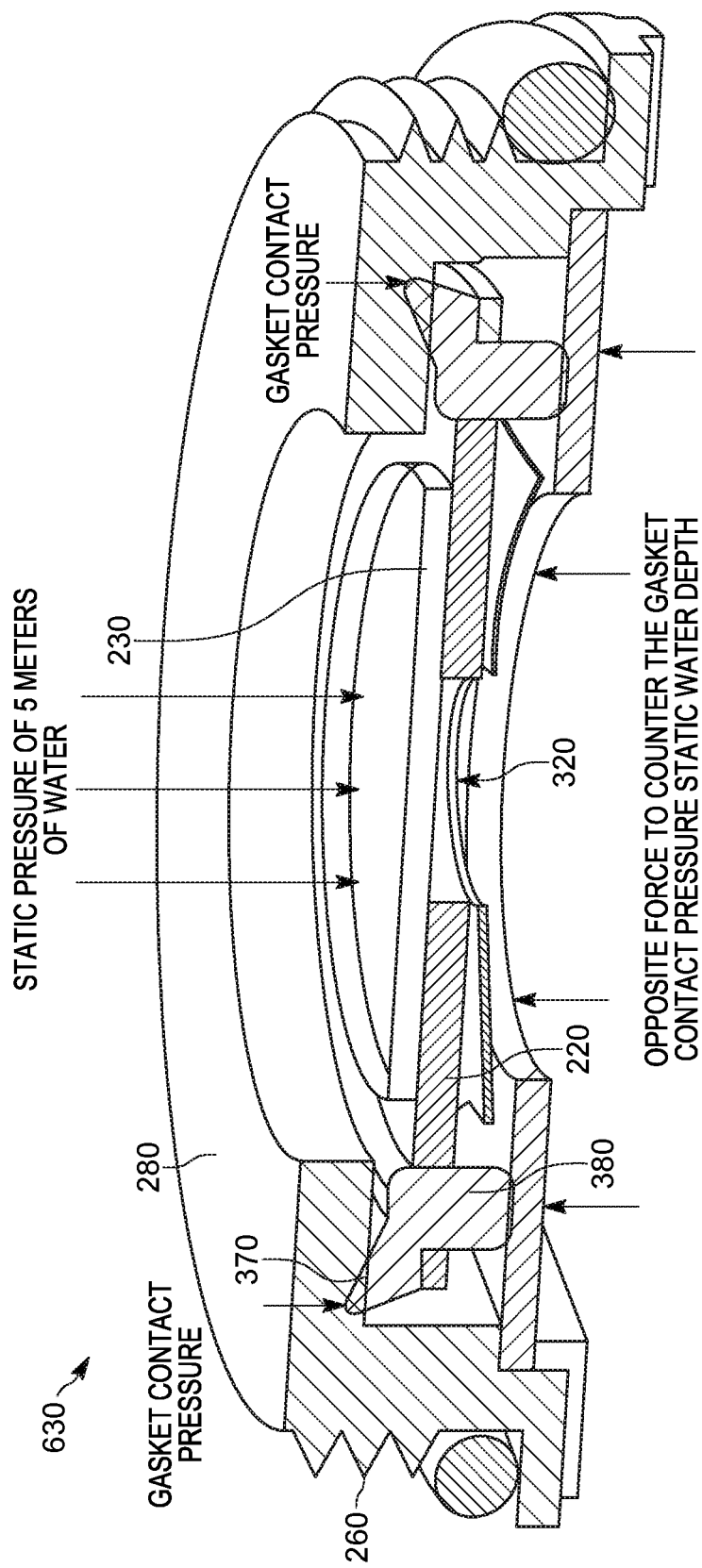
FIG. 10 illustrates a cross section of a simplified version of a breather valve in accordance with some embodiments.
Figure 11:
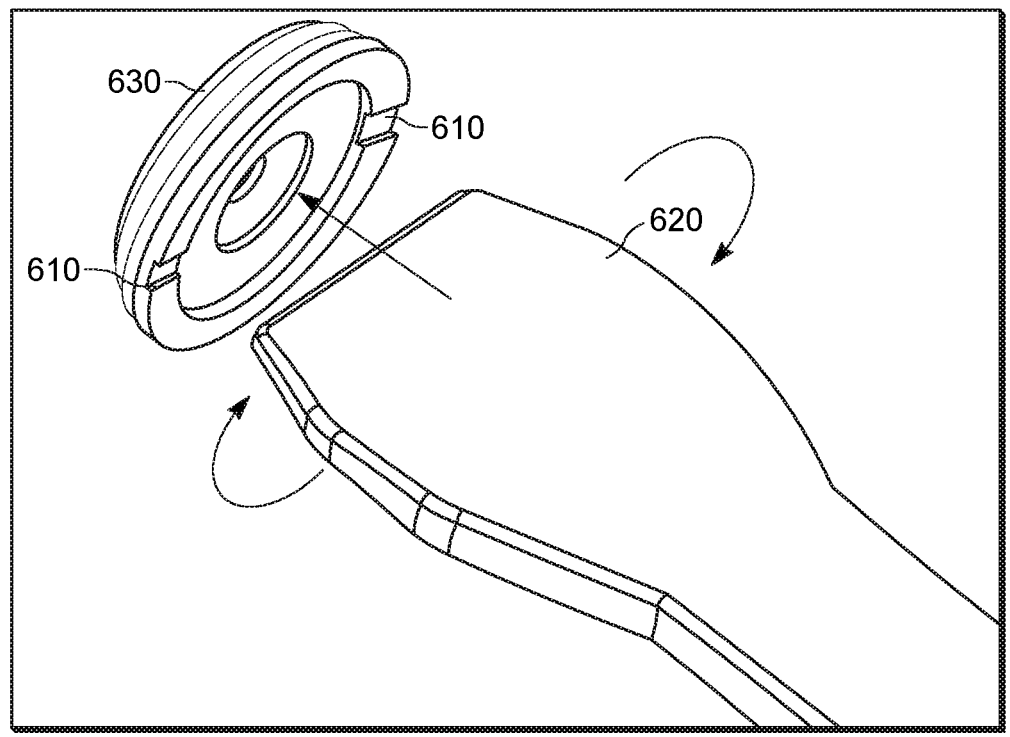
FIG. 11 illustrates a perspective view of the breather valve of FIG. 10 in accordance with some embodiments.
Figure 12:
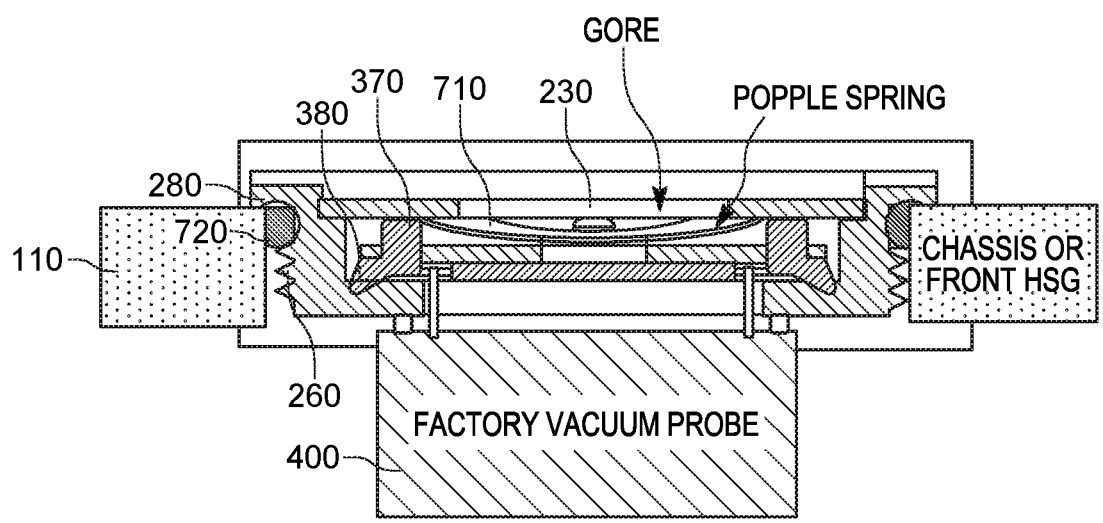
FIG. 12 illustrates a cross section of a simplified version of a breather valve in accordance with some embodiments.
Figure 13:
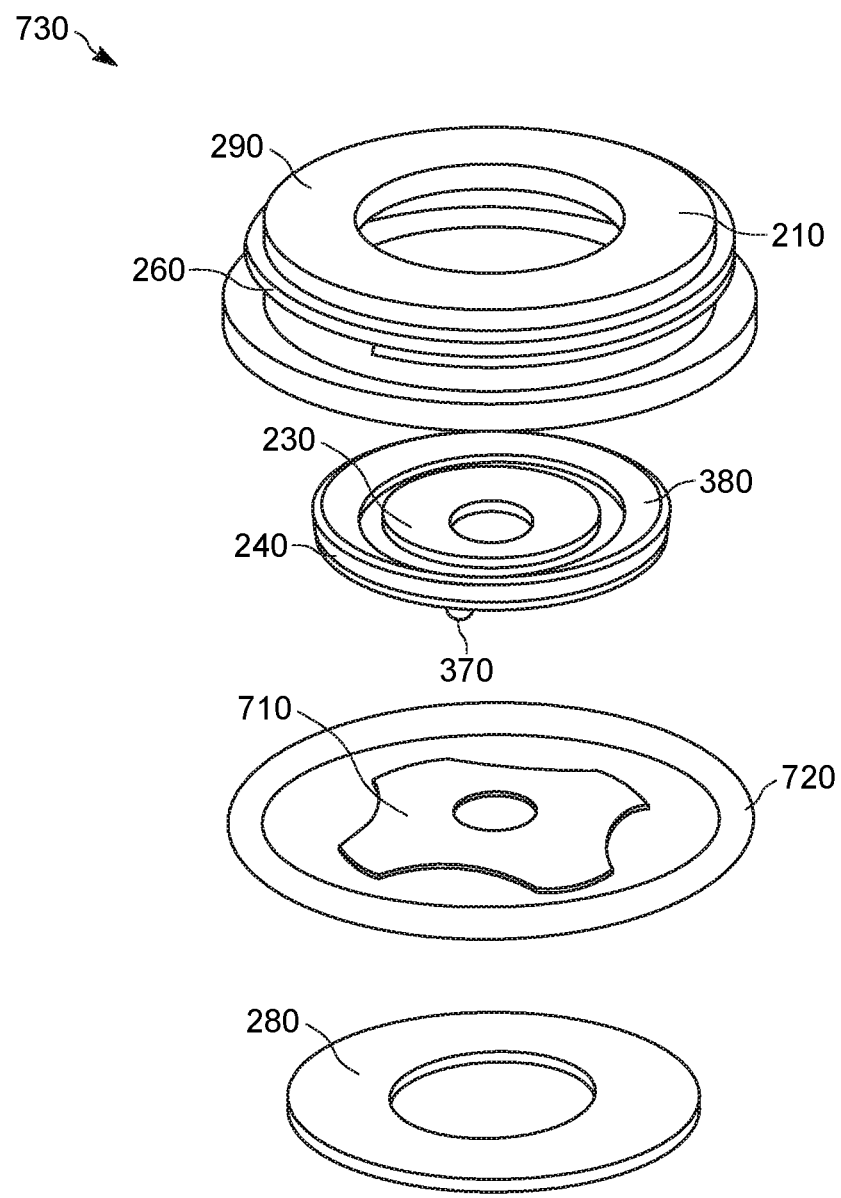
FIG. 13 illustrates an exploded view of the breather valve of FIG. 12 in accordance with some embodiments.
Figure 14:
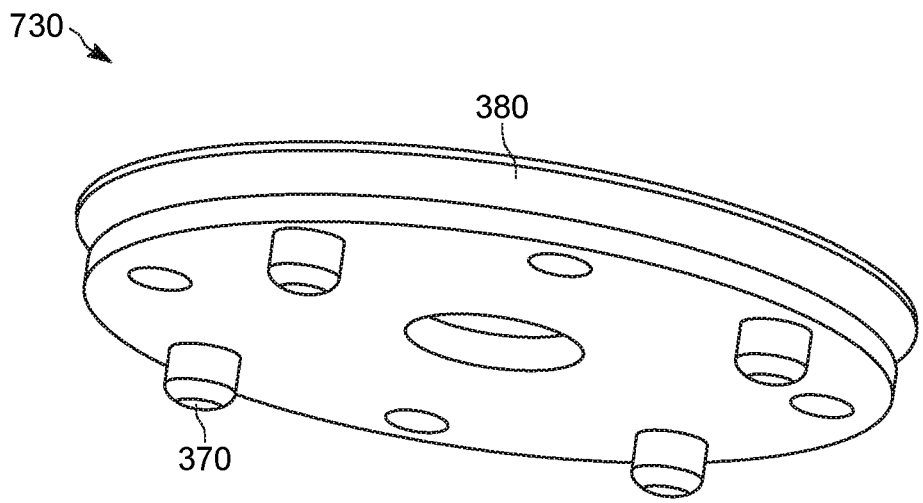
FIG. 14 illustrates a perspective view of the breather valve of FIG. 12 in accordance with some embodiments.
Figure 15:
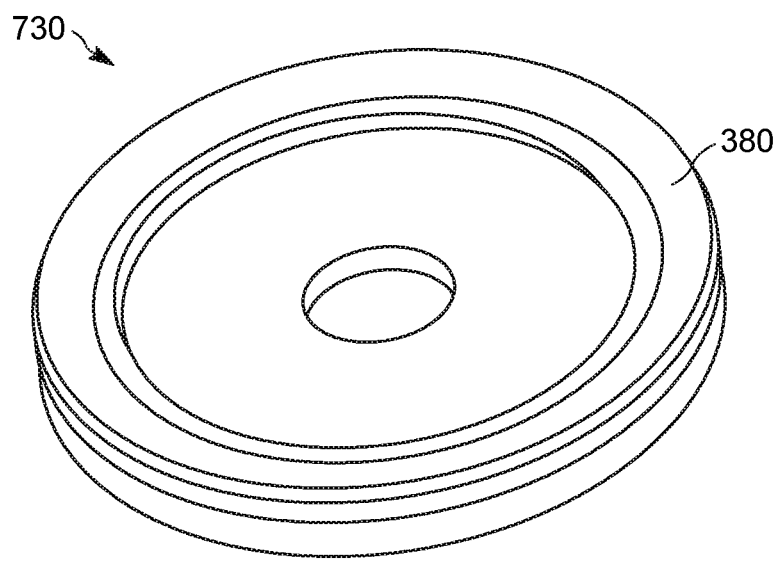
FIG. 15 illustrates a perspective view of the breather valve of FIG. 12 in accordance with some embodiments.

FIG. 10 illustrates a cross-section of one example of a simplified version of a breather valve 630. FIG. 11 illustrates a perspective view of the breather valve 630. The breather valve 630 is constructed similar to the breather valve 130. In the example illustrated, the preloaded compression element 250 is formed integrally with the gasket 240. In this embodiment, the preloaded compression element 250 may also function as the upper energy director 370. The preloaded compression element 250 may be formed of a compressible rubber material. The bottom portion 290 includes install slots 610 that are configured to receive the head of a screw driver 620. The breather valve 630 can therefore be fastened to a valve opening 120 by using the screw driver 620.

FIGS. 12-15 illustrate another example embodiment of a breather valve 730. The breather valve 730 is constructed similar to the breather valves 130 and 630. However, the breathable membrane 230 is not overmolded with the gasket 240. Instead, the breathable membrane 230 is separate from the gasket 240 and does not move with the gasket 240. In this embodiment, the breathable membrane 230 is provided on the top portion 280 of the housing 210. A popple spring 710 is provided between the breathable membrane 230 and the gasket 240. Additionally, the upper energy director 370 includes non-continuous projections. The upper energy director 370 along with the popple spring 710 forms the preloaded compression element 250 in this embodiment. The breather valve 730 also includes an O-ring seal 720 provided on the outside of the housing 210 to seal the housing 210 to the sealed housing 110 of the portable communication device 100.

One advantage of the breather valves 130, 630, 730 is that since the breather valves 130, 630, 730 are self-contained, assembly process on the production line can be eliminated and the processing and testing time can be reduced. Another advantage is that the preloaded compression element 250 ensures that the breather valve 130, 630, 730 is always closed to prevent any fluid ingress into the portable communication device 100. Since the breather valve 130, 630, 730 can be actuated by the probe device 400, the testing processed can be automated. The breather valve 130, 630, 730 does not require any fitting attachments, which helps reduce operator errors.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A breather valve comprising:
a housing;
a rigid substrate located within the housing;
a breathable membrane mounted to the rigid substrate;
a gasket having a top surface and a bottom surface; and a preloaded compression element across the gasket and the rigid substrate, the preloaded compression element providing at least:
a first compressive position, and
a second compressive position.

2. The breather valve of claim 1, wherein the gasket includes an upper energy director located at the top surface and a lower energy director located at the bottom surface.

3. The breather valve of claim 2, wherein the first compressive position provides a contact between the lower energy director and a bottom portion of the housing.

4. The breather valve of claim 2, wherein in the second compressive position air passes around the lower energy director and the upper energy director.

5. The breather valve of claim 3, wherein in the first compressive position, the lower energy director forms a seal around the opening in the bottom portion of the housing to prevent air and water from penetrating through the gasket.

6. The breather valve of claim 2, wherein the housing includes a top portion with a plurality of openings and wherein the preloaded compression element provides a third compressive position providing a contact between the upper energy director and the top portion of the housing.

7. The breather valve of claim 6, wherein in the third compressive position, the upper energy director forms a seal around one of the plurality of openings of the top portion to prevent air and water from penetrating through the gasket.

8. The breather valve of claim 7, wherein the preloaded compression element is normally in the first compressive position and wherein the preloaded compression element may be moved to the second compressive position and the third compressive position by an external probe.

9. The breather valve of claim 1, wherein the rigid substrate is a stainless steel substrate and wherein the breathable membrane is mounted to the rigid substrate with an adhesive seal.

10. The breather valve of claim 1, wherein the gasket is over molded to a perimeter of the rigid substrate and the breathable membrane.

11. The breather valve of claim 1, wherein the preloaded compression element is a preloaded spring.

12. A portable communication device comprising:
a device housing including a valve opening,
a breather valve positioned at the valve opening, the breather valve including:
a housing;
a rigid substrate located within the housing;
a breathable membrane mounted to the rigid substrate;
a gasket; and
a preloaded compression element across the gasket and the rigid substrate, the preloaded compression element providing at least:
a first compressive position, and
a second compressive position.

13. The portable communication device of claim 12, wherein the valve opening includes first threaded grooves and the breather valve includes second threaded grooves such that the breather valve can be fastened into the valve opening.

14. The portable communication device of claim 12, wherein the gasket includes an upper energy director located at a top surface of the gasket and a lower energy director located at a bottom surface of the gasket.

15. The portable communication device of claim 14, wherein the first compressive position provides a contact between the lower energy director and a bottom portion of the housing.

16. The portable communication device of claim 14, wherein in the second compressive position air passes around the lower energy director and the upper energy director.

17. The portable communication device of claim 15, wherein in the first compressive position, the lower energy director forms a seal around the opening in the bottom portion of the housing to prevent air and water from penetrating through the gasket.

18. The portable communication device of claim 14, wherein the housing includes a top portion with a plurality of openings and wherein the preloaded compression element provides a third compressive position providing a contact between the upper energy director and the top portion of the housing.

19. The portable communication device of claim 18, wherein in the third compressive position, the upper energy director forms a seal around one of the plurality of openings of the top portion to prevent air and water from penetrating through the gasket.

20. The portable communication device of claim 19, wherein the preloaded compression element is normally in the first compressive position and wherein the preloaded compression element may be moved to the second compressive position and the third compressive position by an external probe.

* * * * *